United States Patent
Drögemüller et al.

(10) Patent No.: US 11,777,189 B2
(45) Date of Patent: Oct. 3, 2023

(54) HEADER FOR A PACKAGE INCLUDING AN ELECTRONIC COMPONENT FOR RADIO FREQUENCY SIGNAL TRANSMISSION

(71) Applicant: Schott AG, Mainz (DE)

(72) Inventors: Karsten Drögemüller, Eichenau (DE); Artit Aowudomsuk, Bangkok (TH)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 17/720,813

(22) Filed: Apr. 14, 2022

(65) Prior Publication Data

US 2022/0238980 A1 Jul. 28, 2022

Related U.S. Application Data

(63) Continuation of application No. PCT/EP2020/078542, filed on Oct. 12, 2020.

(30) Foreign Application Priority Data

Oct. 14, 2019 (DE) ..................... 10 2019 127 593.8

(51) Int. Cl.
*H01Q 1/02* (2006.01)
*H01Q 1/12* (2006.01)
*H01Q 1/22* (2006.01)

(52) U.S. Cl.
CPC ............. *H01Q 1/02* (2013.01); *H01Q 1/1221* (2013.01); *H01Q 1/2283* (2013.01)

(58) Field of Classification Search
CPC ....... H01Q 1/02; H01Q 1/1221; H01Q 1/2283
See application file for complete search history.

(56) References Cited

U.S. PATENT DOCUMENTS

| 4,989,930 A | 2/1991 | Nakagawa et al. |
| 5,005,178 A | 4/1991 | Kluitmans et al. |
| 2003/0001081 A1 | 1/2003 | Kaneko et al. |
| 2011/0142086 A1 | 6/2011 | Watanabe et al. |

FOREIGN PATENT DOCUMENTS

| DE | 10 2017 120 216 A1 | 3/2019 |
| GB | 317531 | 8/1929 |
| GB | 2 404 281 A | 1/2005 |
| JP | 10-223988 A | 8/1998 |
| JP | 2002026406 A * | 1/2002 |
| JP | 2010-123775 A | 6/2010 |

OTHER PUBLICATIONS

International Search Report dated May 10, 2021 for International Application No. PCT/EP2020/078542 (8 pages).

* cited by examiner

*Primary Examiner* — Hoang V Nguyen
(74) *Attorney, Agent, or Firm* — Taylor IP, P.C.

(57) ABSTRACT

A header, with improved cooling for electronic components for radio frequency signal transmission, for an electronic component for radio frequency data transfer, includes: a metallic base body including a plurality of electrical feedthroughs; a thermoelectric cooling element having one side bearing on the base body and an opposite side for mounting the electronic component; a radio frequency line to the electronic component being on the side for mounting the electronic component, with a ground conductor that is electrically connected to the metallic base body, the electrical connection to the metallic base body including a telluride element.

23 Claims, 10 Drawing Sheets

HEADER FOR A PACKAGE INCLUDING AN ELECTRONIC COMPONENT FOR RADIO FREQUENCY SIGNAL TRANSMISSION

CROSS REFERENCE TO RELATED APPLICATIONS

This is a continuation of PCT application no. PCT/EP2020/078542, entitled "BASE FOR A HOUSING COMPRISING AN ELECTRONIC COMPONENT FOR HIGH-FREQUENCY SIGNAL TRANSMISSION", filed Oct. 12, 2020, which is incorporated herein by reference. PCT application no. PCT/EP2020/078542 claims priority to German patent application no. 10 2019 127 593.8, filed Oct. 14, 2019, which is incorporated herein by reference.

BACKGROUND OF THE INVENTION

1. Field of the Invention

The present invention generally relates to electronic, in particular optoelectronic components for radio frequency signal transmission. More particularly, the present invention relates to the special configuration of a header including a way for cooling electronic components that are intended for the transfer of radio frequency signals, such as laser diodes, optical modulators, photodiodes, and other devices for optical data communication.

2. Description of the Related Art

Data transfer in communication networks requires high frequencies. Current data transfer rates are usually around 25 Gbit/s in the case of 100 Gigabit Ethernet. Work is already underway on the introduction of terabit Ethernet with transfer rates above 100 Gbit/s. A particular challenge for this is the design and manufacture of suitable high-speed transmitters and receivers.

Optoelectronic components that are used as transmitters or receivers, such as laser diodes, are often installed in packages according to the Transistor Outline (TO) standard. Such packages as well as packages according to other standards include a base, referred to as a header, through which signals and supply power are routed, via feedthroughs, to components mounted on the header. A housing attached to the header encloses the installed components, and often a hermetic seal is provided. One problem arising in radio frequency signal transfer is when the signals are fed into the package or out of the package. Here, impedance jumps will lead to signal reflections.

An important aspect is the effective cooling of the active components, which also becomes particularly relevant at high signal frequencies. The cooling aims to achieve a consistent temperature in order to maintain the data rate and laser radiation efficiency and to stabilize the wavelength. Moreover, mode jumps may occur if the temperature is too cold. Active cooling components, in turn, should have a smallest possible impact on the impedance of the assembly. The cooling itself generates waste heat that has to be dissipated. If the waste heat is dissipated to the header, heating of the header may lead to a heat reflux toward the cooled electronic component, which can significantly reduce the cooling efficiency.

Headers for electronic components are known in principle. US 2003/0001081 A1 discloses an optical module in which an electrical feeder line connects a semiconductor laser with a signal input/output unit. The feeder line includes a dielectric substrate with a conductive layer thereon, which has a thermal conductivity that is less than that of alumina. This prevents the semiconductor laser from exhibiting wavelength shifts due to heat flow into the laser.

JP H10 223 988 A describes an optical module with an optoelectronic element and a temperature control element. The temperature stability of the optoelectronic element against fluctuations in ambient temperature is increased by using a radio frequency wiring board including an insulator that has a lower coefficient of thermal conductivity than aluminum.

GB 0317531.2 discloses an optoelectronic assembly including an optoelectronic device, a housing and a thermoelectric cooler. One surface of the cooler is thermally coupled to the optoelectronic device, the other surface is part of a housing portion.

DE 10 2017 120 216 A1 describes a TO package for a DFB laser. This package includes a base part for a thermoelectric cooler. The base part has at least two feedthroughs for connecting an optoelectronic component. A support extends from the upper surface of the base part and has at least two conductor traces arranged thereon, each of which is connected to a respective one of the feedthroughs for connecting the optoelectronic component.

What is needed in the art is a header with improved cooling for electronic components for radio frequency signal transmission.

SUMMARY OF THE INVENTION

The present invention provides a header for an electronic component for radio frequency data transfer, wherein the header includes a metallic base body including a plurality of electrical feedthroughs, and wherein the header includes a thermoelectric cooling element having one side bearing on the base body and an opposite side for mounting the electronic component, wherein a radio frequency line to the electronic component is provided on the side for mounting the electronic component, with a ground conductor that is electrically connected to the metallic base body, and wherein the electrical connection to the metallic base body includes a telluride element.

The ground conductor does not need to be placed directly on the surface of the cooling element. Rather, the ground conductor may also be partially or entirely provided on a submount or carrier attached to the cooling element. In this case, the electronic component can in particular also be mounted on this carrier.

In an optional embodiment, this ground conductor includes an electrical contact on the side of the cooler that is intended for mounting the electronic component. Accordingly, it is contemplated that the header includes a metallic base body including a plurality of electrical feedthroughs, the header including a thermoelectric cooling element having one side bearing on the base body and an opposite side for mounting the electronic component, with an electrical contact provided on the side for mounting the electronic component, which contact is electrically connected to the metallic base body and wherein this connection defines the ground conductor connection of a radio frequency line to the electronic component, and wherein the electrical connection includes a telluride element.

Such a header can be manufactured using a method in which a metallic base body with a plurality of electrical feedthroughs is provided, and a thermoelectric cooling element is connected to the metallic base body at one of its sides, and an electronic component is mounted to an opposite side of the thermoelectric cooling element, and wherein this electronic component is connected to a radio frequency line that includes a ground conductor, and wherein the ground conductor is connected to the metallic base body through a telluride element. More particularly, the side of the cooling element for mounting the electronic component may have an electrical contact which is electrically connected to the metallic base body, and this connection forms the ground conductor connection of a radio frequency line to the electronic component. The electrical connection to the base body is in particular implemented so as to be heat insulating. For the purposes of the present disclosure, this means that the electrical connection can transmit less thermal power for a given temperature difference than the two constituents connected to the electrical connection. The electrical connection is able to reduce heat reflux from the base body which is heated by the thermoelectric cooling element, back to the cooled side of the cooling element and thus to the electronic component. In an optional embodiment, the electrical connection is established using a telluride element.

Tellurides exhibit very low thermal conductivity. According to an optional embodiment, the telluride element contains bismuth telluride, more particularly the telluride element can be a bismuth telluride element. Bismuth telluride is sufficiently electrically conductive. At the same time, it exhibits low thermal conductivity. Electrical conductivity is typically about $1.1 \cdot 10^5$ S·m/m². But thermal conductivity is very low, namely 1.20 W/(m·K). An electrical connecting member made of this material allows to arrange in a very small space the heat-dissipating surface of the thermoelectric cooling element bearing on the base body and the electrical contact of the cooling plate, without causing any significant thermal heat reflux from the base body back to the cooled side of the thermoelectric cooler.

More generally, this embodiment is not limited to a telluride element made of a high-purity material. Rather, the telluride, such as in particular bismuth telluride, may also contain admixtures, for example in the form of a dopant. Within the sense of the invention, a bismuth telluride element is generally understood to mean an element which predominantly contains bismuth telluride ($Bi_2Te_3$). According to one embodiment, bismuth telluride may generally contain antimony telluride and bismuth selenide as admixtures. Bismuth telluride solid solutions including such admixtures may have further enhanced properties compared to pure bismuth telluride, in particular further reduced thermal conductivity. According to one embodiment, the telluride element accordingly contains at least one of the constituents antimony telluride and bismuth selenide. Antimony telluride as well as lead telluride can also be used as an alternative to the bismuth telluride as the main component of the telluride element.

Furthermore in this case, it is particularly favorable for the electronic component to have a ground contact that is connected to the base body via the telluride element. This ground connection is connected to the base body through the telluride element. This enables a particularly compact arrangement and thus lower attenuation of the radio frequency signals, as well as particularly efficient heat transfer from the electronic component to the plate of the thermoelectric cooler. The header may in particular be designed for a TO package.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrates embodiments of the invention, and such exemplifications are not to be construed as limiting the scope of the invention in any manner.

DETAILED DESCRIPTION OF THE INVENTION

Figure 1:
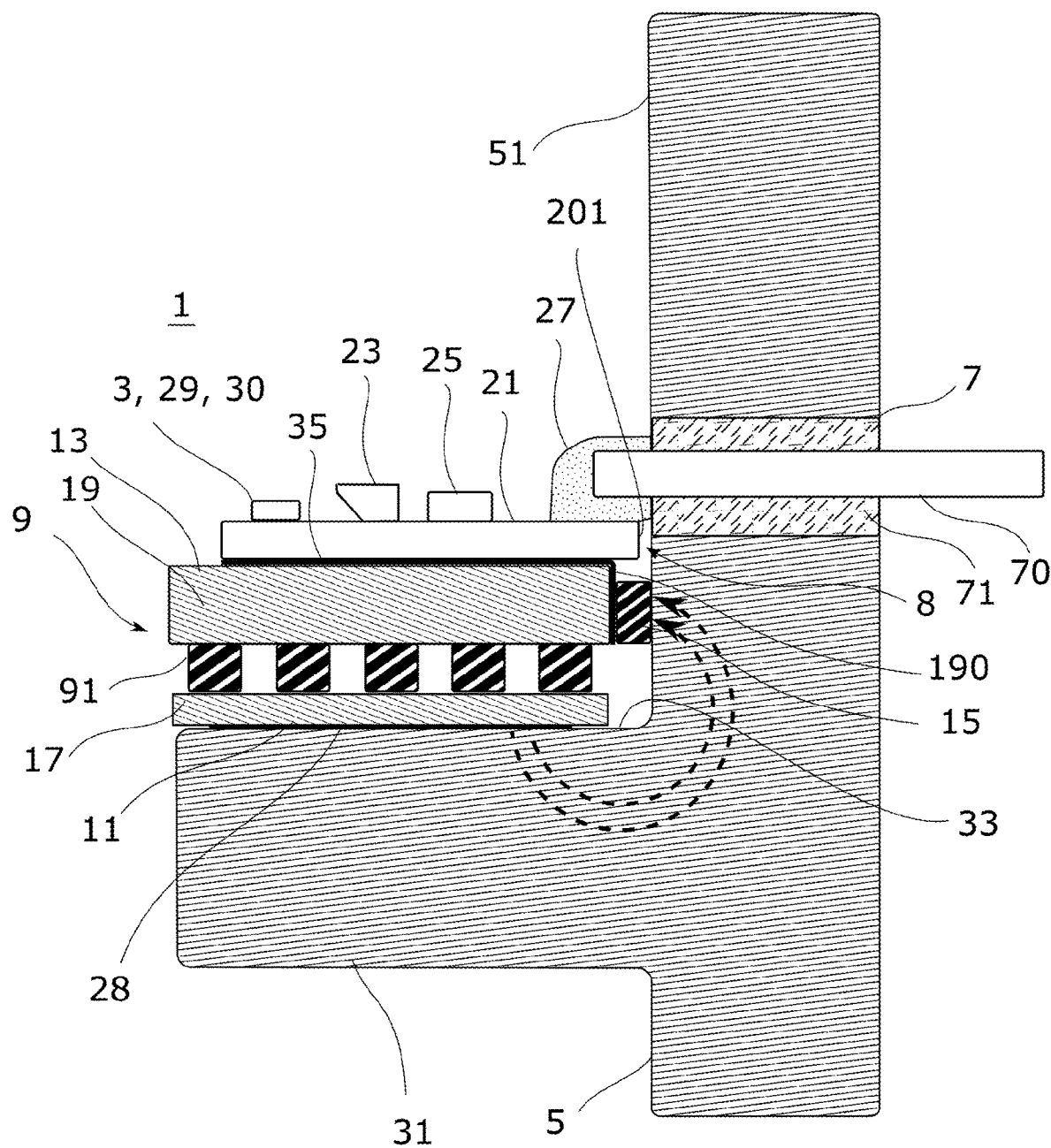
FIG. 1 is a side view of a header with an electronic component.

FIG. 1 shows a header 1 for an electronic component 3. Header 1 may be dimensioned for a TO package, for example. In order to obtain a closed package, a cap can be joined to the metallic base body, which cap encloses the electronic component 3. According to an optional embodiment, not limited to the illustrated example, it is contemplated that the electronic component 3 is an optical transmitter 29. Such an optical transmitter 29 may in particular be a laser diode 30. In the case of laser diodes for radio frequency signal transmission, temperature stabilization is particularly advantageous for maintaining consistent transmission properties such as wavelength and light power.

For routing the signal voltages and power supply voltages through the header 1, the metallic base body 5 includes a plurality of electrical feedthroughs 7. The view of FIG. 1 only shows a single feedthrough 7. Each of the feedthroughs 7 includes a feedthrough conductor 70 which is fixed relative to the base body 5 by an insulation 71, in an electrically insulating manner. The insulation may be made of plastics material, ceramics, or optionally glass.

In order to cool the electronic component 3 or to keep its temperature consistent, the header 1 furthermore includes a Peltier element or, more generally, a thermoelectric cooling element 9. Cooling element 9 includes a hot side and a cold side, depending on the direction of current flow. Usually, the thermoelectric cooling element is arranged such that one of its sides, here side 11, is bearing on the metallic base body 5 and is in thermal communication with the base body 5, so that the waste heat generated during the cooling of the electronic component can be dissipated to the base body 5 which serves as a heat sink.

The opposite side 13 of thermoelectric cooling element 9, which is in particular cooled by the Peltier effect, is intended for mounting the electronic component 3. This side 13 has an electrical contact 35 which is electrically connected to the metallic base body 5. This connection may in particular be the ground conductor connection of a radio frequency line to the electronic component. The electrical connection between contact 35 and the metallic base body is established via a telluride element 15. In order to enable effective and easily controllable cooling of the electronic component 3, heat reflux from the base body 5 to the cooled side of the cooling element 9 should be suppressed. In particular, an electrical connection via a large surface area can lead to a short circuit in the heat flux. This short circuit is indicated in FIG. 1 by the dashed arrows emanating from the support surface 33 of the pedestal and terminating at the contact with the cooled side 13 that is intended for mounting the electronic component 3. Such short circuit is interrupted by the telluride element 15, since the element significantly reduces heat reflux from the base body 5 back to the cooled side 13 of the thermoelectric element 9.

Optionally, the telluride element is a bismuth telluride element which may optionally also contain other constituents such as antimony telluride or bismuth selenide.

The telluride element 15 may generally have a rod- or strip-like shape, with larger dimensions transversely to the direction of current flow than along the direction of current flow, i.e. the spacing between the two surfaces in contact with the thermoelectric cooling element 9 and the base body 5, respectively. The current thus traverses the telluride element transversely. This provides a good, low resistance electrical connection while still keeping the heat transfer low.

Without being limited to the illustrated example, the thermoelectric element 9 includes two plates 17, 19, with semiconductor elements 91 arranged therebetween. The outer surfaces of the two plates define the sides 11, 13 for contacting the header, and for mounting the electronic component 3, respectively. Typically, the plates 17, 19 are made of ceramic material.

In an optional embodiment, which is also implemented in the special exemplary embodiment of the header 1 according to FIG. 1, the base body 5 of the header 1 has a pedestal 31 with a support surface 33 on which the thermoelectric cooling element 9 is attached. As illustrated, this allows the side 13 of the thermoelectric cooling element 9 to be oriented such that the axial direction of at least one feedthrough conductor 70 of one of the electrical feedthroughs 7 is in parallel to the surface or side 13 of the thermoelectric cooling element 9. This arrangement has several advantages with regard to the functionality of the device. One advantage is the possibility of easily electrically connecting the electronic component 3 using short electrical links, which is favorable for the radio frequency transfer properties. A further advantage is the improved heat dissipation via base body 5 of the header due to the increased surface area by virtue of the pedestal 31.

It is conceivable for an electronic component 3 to be directly mounted on the thermoelectric cooling element 9. However, according to an optional embodiment, without being limited to the illustrated example, it is generally contemplated for the electronic component 3 to be mounted on a carrier 21, with the carrier 21 bearing on the side 13 of the thermoelectric cooling element 9 intended for mounting the electronic component 3. Such a carrier 21 is commonly also referred to as a submount. This embodiment makes it possible, inter alia, to jointly mount a plurality of electronic components on the carrier 21 and to then attach the carrier 21 on the thermoelectric cooling element 9. Thus, the electronic component 3 is in fact mounted on the cooling element 9 as well in this embodiment, although indirectly, as a component connected to the carrier 21. In particular, as is the case in the illustrated example, this allows the feedthrough conductor 70 to be directly connected to the carrier 21, in particular to a conductor trace on the carrier 21, via a solder connection 27, in order to keep the conductive lengths short.

As in the example shown in FIG. 1, it is optional that the side 13 of the thermoelectric cooling element 9 for mounting the electronic component 3 is defined by a plate 19 of the thermoelectric cooling element 9, and that the telluride element 15 is disposed on an edge face 190 of the plate 19. In this way, a planar surface can be provided on the side 13, which facilitates the mounting of the respective individual components, in particular the attachment of a submount or carrier 21. According to an optional embodiment of the invention, a submount or carrier 21 is provided, which is fixed to the base body 5 in such a way that there is a gap 8 between the base body 5, in particular an inner surface 51 of the base body 5, and an edge 201 of the carrier 21. In the exemplary embodiment shown in FIG. 1, the gap 8 between the inner surface 5 of base body 5 and the edge 201 is obtained by placing the carrier 21 on the support surface 33 of pedestal 31. The inner surface 51 of base body 5 is that side on which the electronic component 3 is provided and which delimits an interior of the packaged electronic component after further encapsulation. Gap 8 is particularly favorable with regard to the transfer of radio frequency signals. Another advantage is that in this way impedance matching or, more generally, adjustment of the radio frequency transfer properties can be easily achieved by adjusting the width of the gap. According to one embodiment, the width of the gap 8 may range from 0.1 to 5 times the thickness of the submount or carrier 21.

For electrically connecting the conductor traces which carry radio frequency signals to the electronic component 3, it has proven advantageous to use an Au/Sn solder. According to one embodiment, it is therefore contemplated that the feedthrough conductor 70 is directly connected to the carrier 21, in particular to a conductor trace on the carrier 21, via a solder connection 27, and that the solder connection 27 is made using a gold-tin solder. This embodiment allows, inter alia, to mount the electronic component 3 such as in particular an optical transmitter 29, optionally a laser diode 30, on the conductor trace using an Au/Sn solder, while preventing the connection between feedthrough conductor 70 and conductor trace 36 from re-melting.

According to yet another embodiment it is contemplated that the electronic component 3 and the thermoelectric cooling element 9 are mounted using a gold-tin solder. This solder, usually in an alloy containing 80% of gold and 20% of tin, combines great hardness with high electrical conductivity. The solder moreover exhibits high thermal conductivity (0.57 W/cm·K at 85° C.). In this way, very good thermal contact is achieved between the hot side 11 of the thermoelectric cooling element 9 and the base body 5 of header 1. In the example shown in FIG. 1, an attachment layer 28 is provided, which bonds the side 11 of thermoelectric cooling element 9 to the support surface 33 of pedestal 31. It will be appreciated, however, that the use of Au/Sn solder for bonding the thermoelectric cooling element 9 and/or for mounting the electronic component is independent of the shape of the base body 5. The use of Au/Sn solder for attaching the cooling element 9 and for mounting the electronic component 3 is furthermore advantageous because it allows to attach the cooling element 9 on the base body 5 and to mount the electronic component 3 in a single step using a heater. Conventional processes, by contrast, include preassembly of the electronic component 3 such as in particular a laser diode 30 on the submount or carrier 21. The mounting of the carrier 21 and of the thermoelectric cooling element 9 is then accomplished using low-melting solders or conductive epoxy, since otherwise the connection to the electronic component 3 could melt and the component 3 might become offset as a result. The implementation of the solder connection 27 to the signal-carrying pin using an Au/Sn solder is also advantageous in this context, since this solder connection will not melt when the pedestal 31 with the cooling element 9 and submount is heated up locally.

For operating an electronic component 3 in the form of a laser diode 30, it is contemplated according to one embodiment of the invention that the header 1 includes further electronic components in the form of a temperature sensor 25 and/or a monitoring diode 23. A thermistor can optionally be used as the temperature sensor 25, but it is also possible to use other electronic components which have a temperature-dependent characteristic, such as ceramic capacitors, for example. The monitoring diode can be used to sense and monitor the power output of the laser diode 30, for example, or of another light-emitting semiconductor component such as a light-emitting diode.

The submount or carrier 21 has a planar back-side contact on the side that is in contact with the thermoelectric cooling element 9. A planar back-side contact as provided here is used to provide an electrical connection to the electronic component 3 in the form of a waveguide transmission line for radio frequency signals or a radio frequency line 12 from or in particular to the electronic component 3, in particular in the form of a strip-type waveguide also known as a microstrip, or a Conductor-Backed CoPlanar Waveguide (CBCPW) with ground. Electrically connecting the planar back-side contact via the telluride element 15 provides a large surface area low impedance connection to the base body 5 without having to accept high heat transfer. Especially in combination with the contacting of the thermoelectric cooling element 9 via a telluride element 15 as disclosed herein, the direct electrical connection via the feedthrough conductor is of particular advantage for achieving high data transfer rates with at the same time good cooling. According to one embodiment, without being limited to the specific illustrated example, it is therefore generally contemplated that the electronic component 3 is mounted on a carrier 21 which is connected to the thermoelectric cooling element 9 and which has a conductor trace for electrically connecting the electronic component 3, which is directly connected to the feedthrough conductor 70 of one of the feedthroughs 7 through a solder connection 27.

Figure 2:
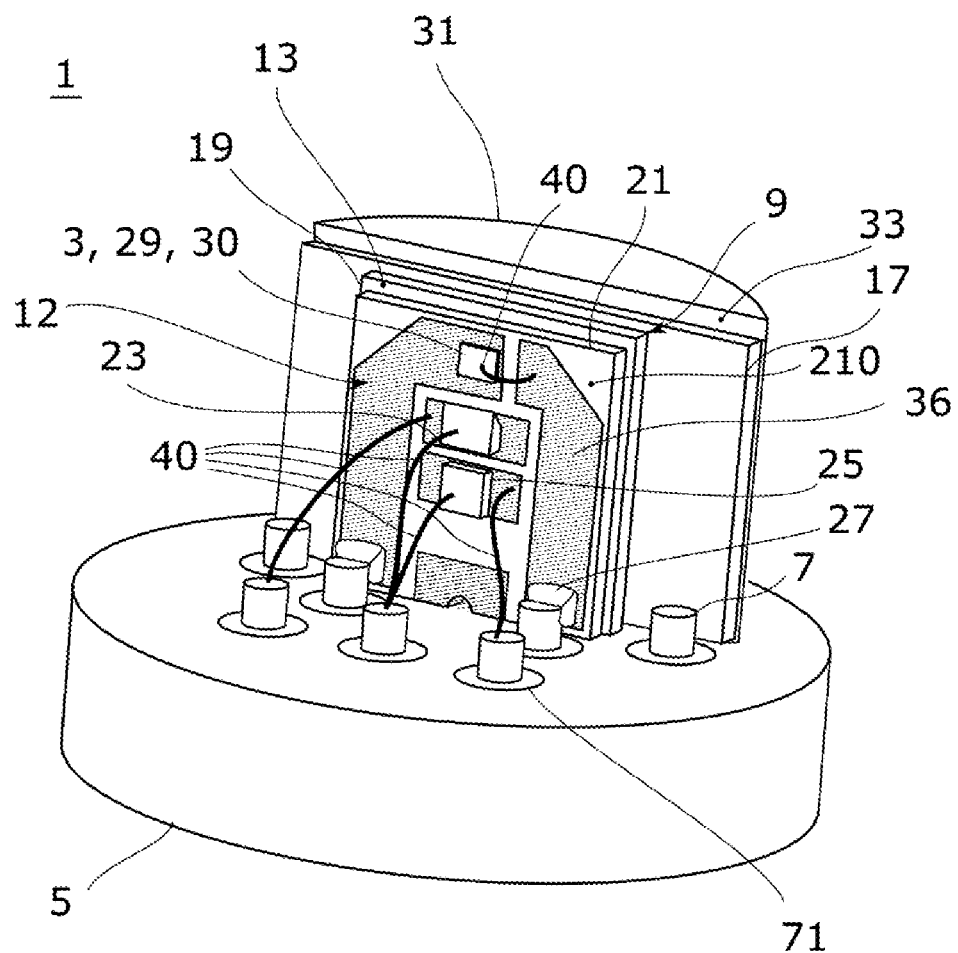
FIG. 2 is a perspective view of a header.

FIG. 2 shows a perspective view of a header 1. As can be seen in this view, the header 1 has a plurality of feedthroughs 7. Carrier 21 has conductor traces 36 leading to the laser diode 30. The conductor traces 36 for electrically connecting the laser diode 30 are both directly connected to the feedthrough conductors 70 of the feedthroughs 7 as shown in FIG. 1, without using a bonding wire 40. A short bonding wire 40 is only provided here for making contact with the upper side of laser diode 30, by way of example. However, it is likewise conceivable for the laser diode 30 to have contacts on the underside thereof, so that it can be directly connected to the conductor traces on both sides by an appropriate solder connection. For the other electronic components, here again monitoring diode 23 and temperature sensor 25, the readout rates are usually comparatively low, so that the impedance of the electrical connections is not critical. In this case, longer bonding wires 40 may be provided for connection purposes, as shown. One of the two conductor traces to the electronic component 3 defines a radio frequency line 12 to the electronic component 3 in combination with the back-side contact which is obstructed in this view, optionally in the form of a microstrip line.

Figure 3:
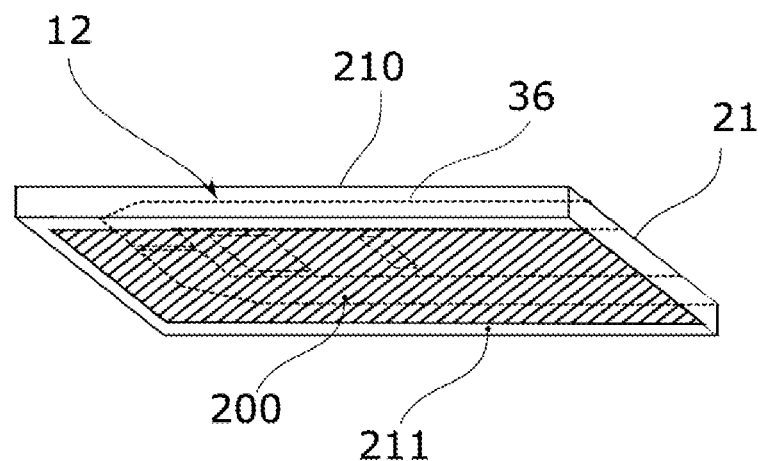
FIG. 3 is a perspective view of a submount or carrier for the electronic component.

FIG. 3 shows a perspective view of a submount or carrier 2. What can be seen in the illustrated view is the rear side 211 which is opposite to the mounting surface 210 on which the electronic component 3 is mounted. The conductor traces 36 on the mounting surface 210 that is obstructed in this view but is visible in FIG. 2 are indicated by dashed lines for better comprehension. Together with the back-side contact, at least one of the conductor traces 36 defines a radio frequency line 12 to the electronic component 3 for carrying radio frequency signals from or to the electronic component 3 with little loss. As mentioned above, this back-side contact may be employed as part of a grounded coplanar waveguide transmission line or grounded strip-type waveguide to the electronic component. If the carrier 21 is placed with the back side 211 on side 13 of the thermoelectric cooling element 9, the back-side contact 200 can be connected to the electrical contact 35 of the cooling element 9. Accordingly, the back-side contact 200 will then be connected to the base body 5 via the telluride element 15, just like the electrical contact 35 of the cooling element 9. The configuration with a back-side contact 200 on a submount or carrier 21 is optional, but other implementations for coplanar waveguides or strip-type waveguides with ground are possible as well. For example, a separate carrier 21 does not necessarily have to be provided. More generally, a basic idea is to provide at least one electrical connection to the electronic component 3 in the form of a grounded coplanar waveguide, and that this waveguide includes an electrode that is grounded via the telluride element 15 or, more generally, makes electrical contact with the base body 5 via the telluride element 15. As mentioned before, this electrode is optionally defined by a planar back-side contact on the carrier 21. A further advantageous effect achieved by the configuration of a header 1 as described herein is shielding the thermoelectric cooling element 9 from the radio frequency signals. This shielding is achieved by the optional planar contact 35 on side 13 of the thermoelectric cooling element 9 and/or the back-side contact on carrier 21.

Figure 4:
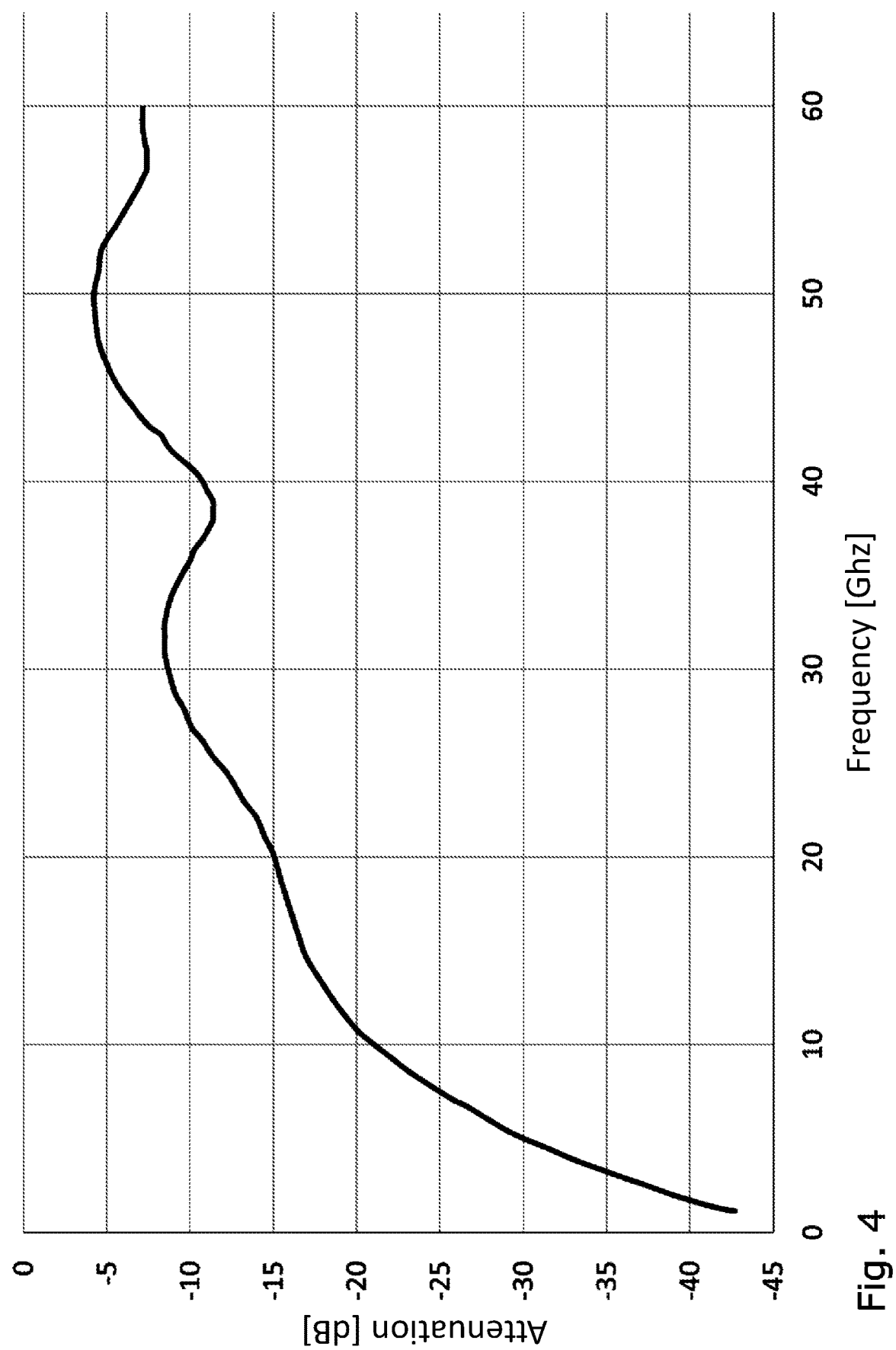
FIGS. 4 and 5 show the frequency-dependent profile of scattering parameters S11 and S21 for headers with a bismuth telluride contact and a gold contact.

If, as suggested here, bismuth telluride is used as a bridge for a ground contact for producing radio frequency waveguides, it should actually be of concern that the attenuation of the system might increase due to the reduced conductivity. However, a comparison of the radio frequency properties thereof with those of a highly conductive gold contact reveals no significant changes. With regard to this issue, FIGS. 4 and 5 show simulations of scattering parameters S11 and S21 as a function of frequency.

Scattering parameter S11 refers to the reflection factor at the input in the case of impedance-matched output. S21 corresponds to the forward transmission factor in the case of impedance-matched output.

Gold has an electrical conductivity of $4.1 \cdot 10^7$ S·m/m². This value is greater than the conductivity of BiTe by a factor of 370. Nevertheless, the scattering parameter S11 as plotted in FIG. 4 does not show any difference representable on the scale of FIG. 4 between a bridge made of gold and a bridge made of bismuth telluride.

Figure 5:
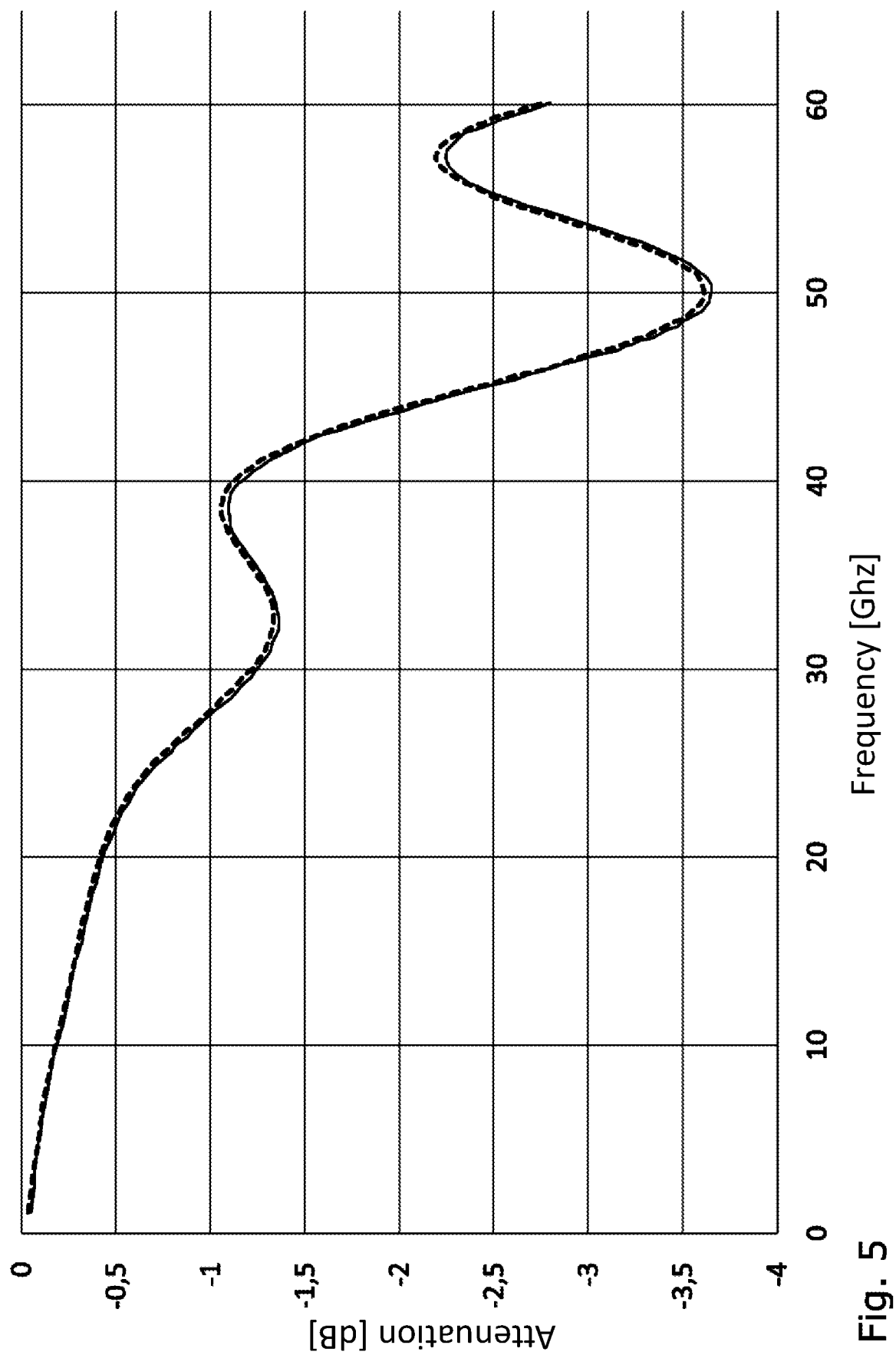

The profile of scattering parameter S21 as shown in FIG. 5 also shows no significant differences in the frequency range from 0 Hz to 60 GHz. The solid line is the scattering parameter profile for a BiTe bridge, and the dashed line is the corresponding profile for a gold bridge.

Figure 6:
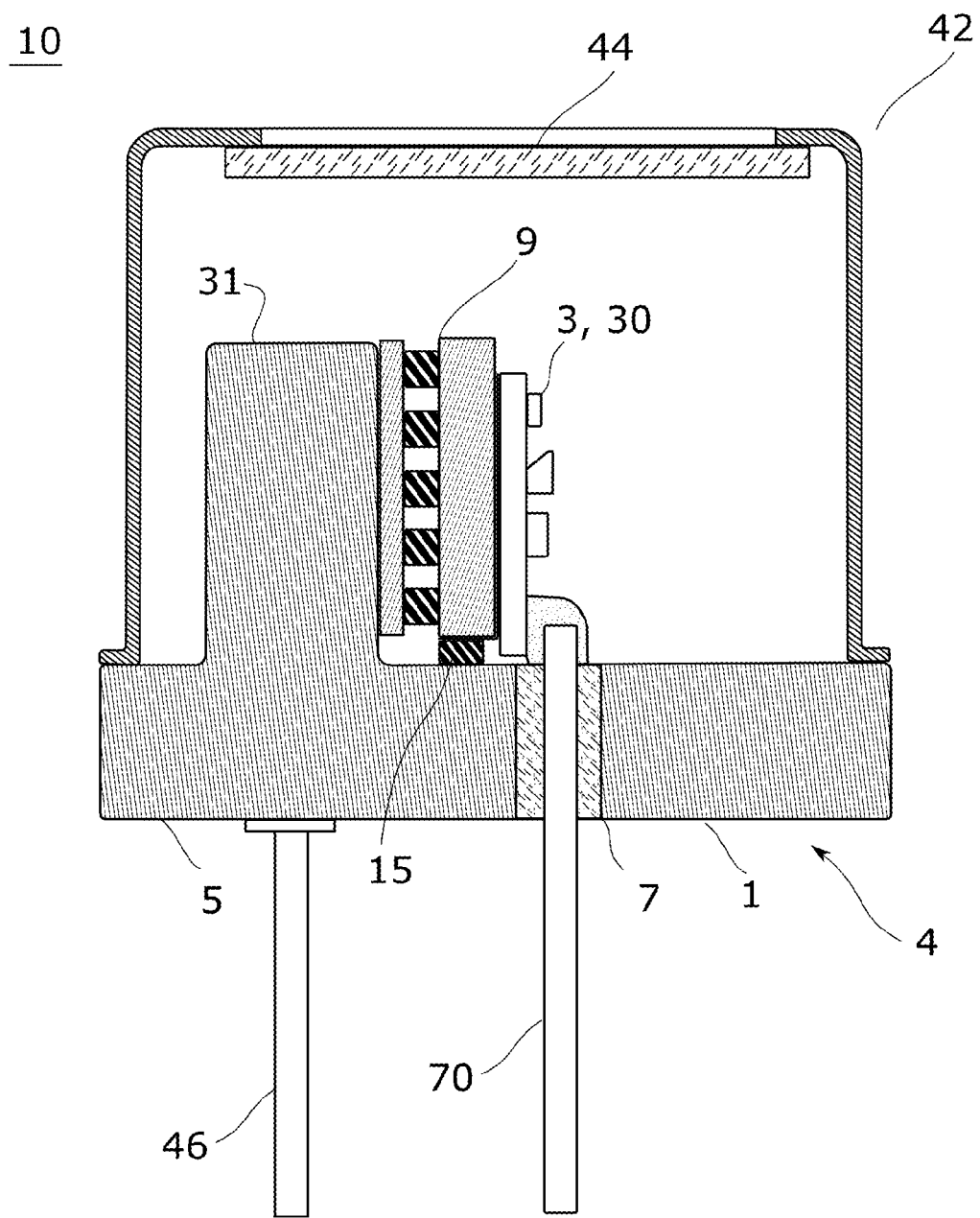
FIG. 6 shows a packaged electronic component including a header according to FIG. 1 or FIG. 2.

In addition to the header 1, the present disclosure also provides a packaged electronic component 10 including the header 1. The electronic component 10 can be a laser module including a TO package, for example. FIG. 6 shows a packaged electronic component 10 including a header 1 according to the present disclosure. The header 1 of this example corresponds to the embodiment of FIG. 1.

In order to provide a packaged electronic component 10, the electronic component 3 on the header is encapsulated in a sealed package 4. For this purpose, the header 1 is bonded to a cap 42. Cap 42 can advantageously have a window 44 so that light can exit the housing 4 or can enter the housing. Window 44 may be bonded to the cap 42 by a glass solder, for example. A ground pin 46 for connection to ground can be fixed on the base body 5, which connects the thermoelectric cooling element 9 via the telluride element 15. Due to the electrical connection to the base body 5 that is provided, the ground pin 46 does not require a feedthrough and can therefore be directly soldered or welded to the base body 5.

The method for producing the header 1 basically includes connecting one side 11 of a thermoelectric cooling element 9 to the metallic base body 5, and mounting the electronic component 3 on the opposite side 13 of the thermoelectric cooling element 9, and electrically connecting an electrical contact 35 on side 13 to the metallic base body 5 by establishing the electrical connection via a telluride element 15. This electrical connection provides the ground connection for the radio frequency line. According to one embodiment, a gold-tin solder is used for producing the connection between the thermoelectric cooling element 9 and the base body 5 and for mounting the electronic component 3, as already mentioned above. This moreover provides for simpler fabrication with precise alignment of the electronic component 3. The latter is particularly important in the case of optoelectronic components such as laser diodes. The method will now be explained with reference to FIGS. 7 to 9.

Figure 7:
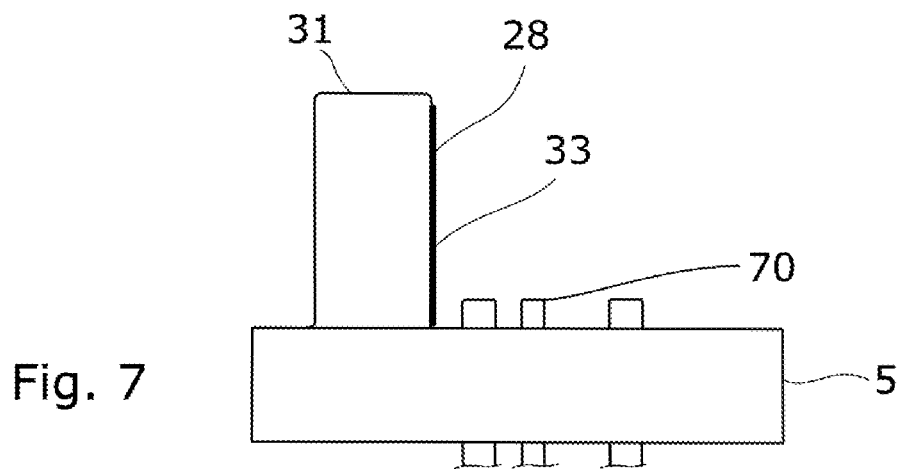
FIGS. 7 to 9 illustrate process steps for making a header.

FIG. 7 shows the base body 5 provided for producing the header, which includes a plurality of feedthroughs. The side view shows the feedthrough conductors 70 of the feedthroughs protruding from the base body 5. As in the previous examples, the base body has a pedestal 31 with a support surface 33. The thermoelectric cooling element 9 is arranged and fixed on this support surface 33. A gold-tin solder is used for this purpose, which forms an attachment layer 28 for the thermoelectric cooling element 9. In the illustrated example, the solder has already been applied.

Figure 8:
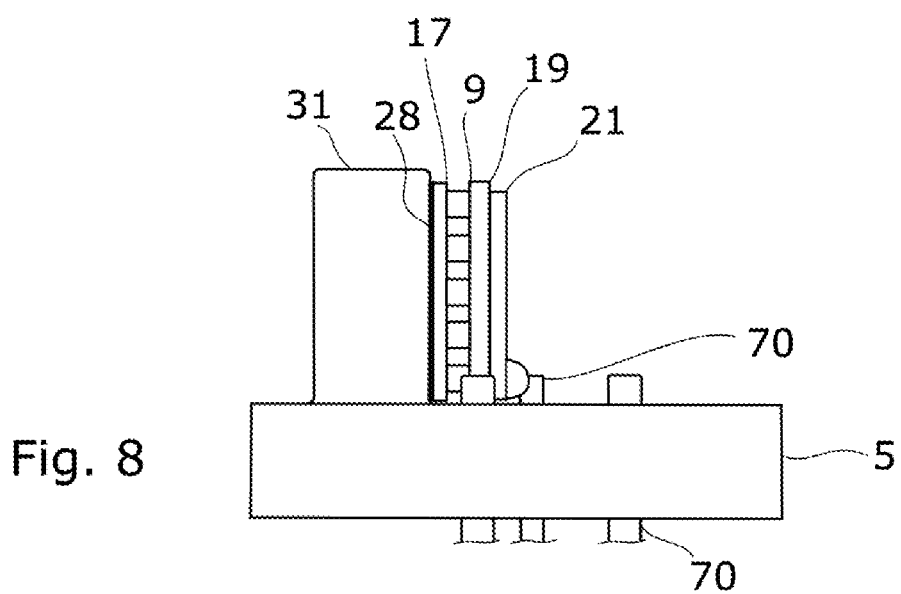

In a next step, as shown in FIG. 8, the thermoelectric cooling element 9 is placed together with the carrier 21, and a radio frequency transmission conductor trace of the carrier 21 is connected to the dedicated feed-through conductor 70 by a solder connection 27. In particular a gold-tin solder is used for the solder connection 27. At the same time as this solder connection is produced it is also possible to produce the connection of the telluride element 15 between plate 19 of the thermoelectric cooling element 9 and the base body 5. This connection can also be made using a gold-tin solder. In the side views of FIGS. 7 to 9, however, the telluride element 15 is obstructed by one of the feed-through conductors and is therefore not shown.

Figure 9:
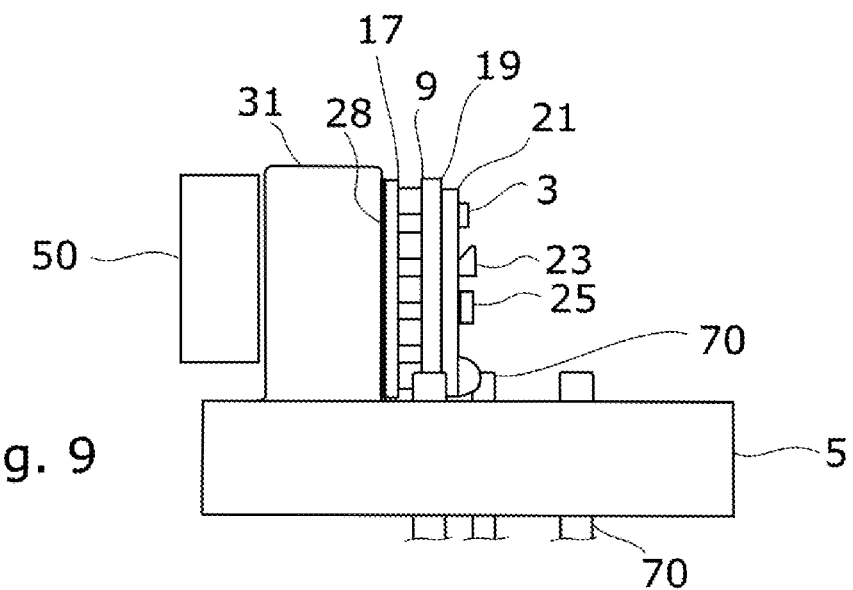

According to one possible embodiment, as shown in FIG. 9, the electronic component 3 and optionally further components, here again a monitoring diode 23 and a temperature sensor 25, are then placed and aligned and the pedestal 31 is heated using a heating element 50 so that the gold-tin solder of the attachment layer 28 melts. At the same time, the solder connection for the electronic component 3 melts and fixes the electronic component 3 once cooled.

This procedure, according to which the adjustment of the component and the attachment of the cooling element are achieved simultaneously, makes it possible to use gold-tin solder both for the solder connection 27 and for the attachment layer 28 as well as for the mounting of the electronic component. By contrast, if the steps are performed one after the other, different solders are required in order to avoid re-melting of previously made solder bond and possible maladjustments associated therewith. If gold-tin solder (80% gold, 20% tin) is used on gold-plated surfaces, the fact that the molten solder dissolves the gold layer on the component thereby incorporating it into the alloy allows to sequentially solder using the same basic alloy. The incorporation of the gold from the coating into the eutectic alloy raises the melting point of the latter, so that this solder bond will not re-melt when it is heated again to the soldering temperature of the eutectic solder.

Therefore, without being limited to the specific illustrated examples, it is generally contemplated according to a an optional embodiment of a method for producing a header 1 for an electronic component 10 for radio frequency data transfer, that the bonding of the thermoelectric cooler 9 to the base body 5 and the mounting of the electronic component 3 is made using the same solder, in particular a gold-tin solder, and that the solder for the mounting of the electronic component 3 and the thermoelectric cooler 9 is melted in a heating step.

Figure 10:
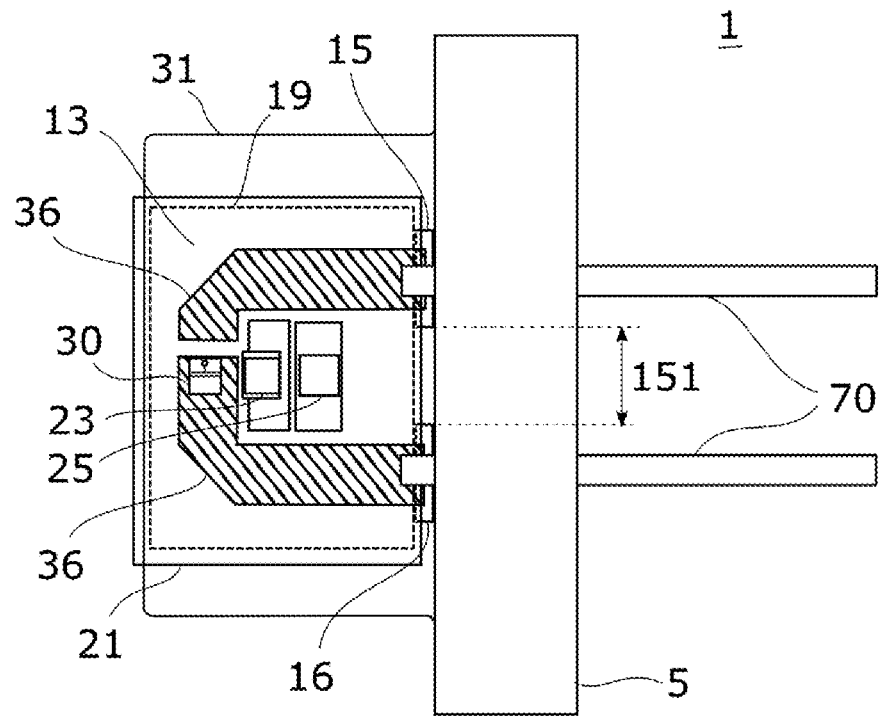
FIG. 10 shows an embodiment including two separate telluride elements.

FIG. 10 shows a plan view of the submount or carrier 21 of a further embodiment of a header 1. In this view, the thermoelectric cooling element 9 is obstructed by the carrier 21, and its plate 19 on which the carrier 21 is supported is indicated in broken lines. As can be seen, this embodiment generally includes a pair of telluride elements separated by a gap 151, without being limited to the particular illustrated example.

A side view of this embodiment can correspond to the example of FIG. 1. Accordingly, the cold side 13 of thermoelectric cooling element 9 includes an electrical contact 35 which is provided on plate 19. The telluride elements 15, 16 establish electrical connections between the electrical contact 35 and the base body 5 of header 1.

Dividing the electrical connection to two telluride elements involves a smaller contact area, so that the heat flux from the base body back to the electronic component can be further reduced. Furthermore, tellurides such as in particular bismuth telluride are brittle materials. The distributing into two or more than two separate elements reduces the risk of breakage. Otherwise, a fracture in the telluride element could adversely affect the radio frequency properties in an unforeseen manner.

Figure 11:
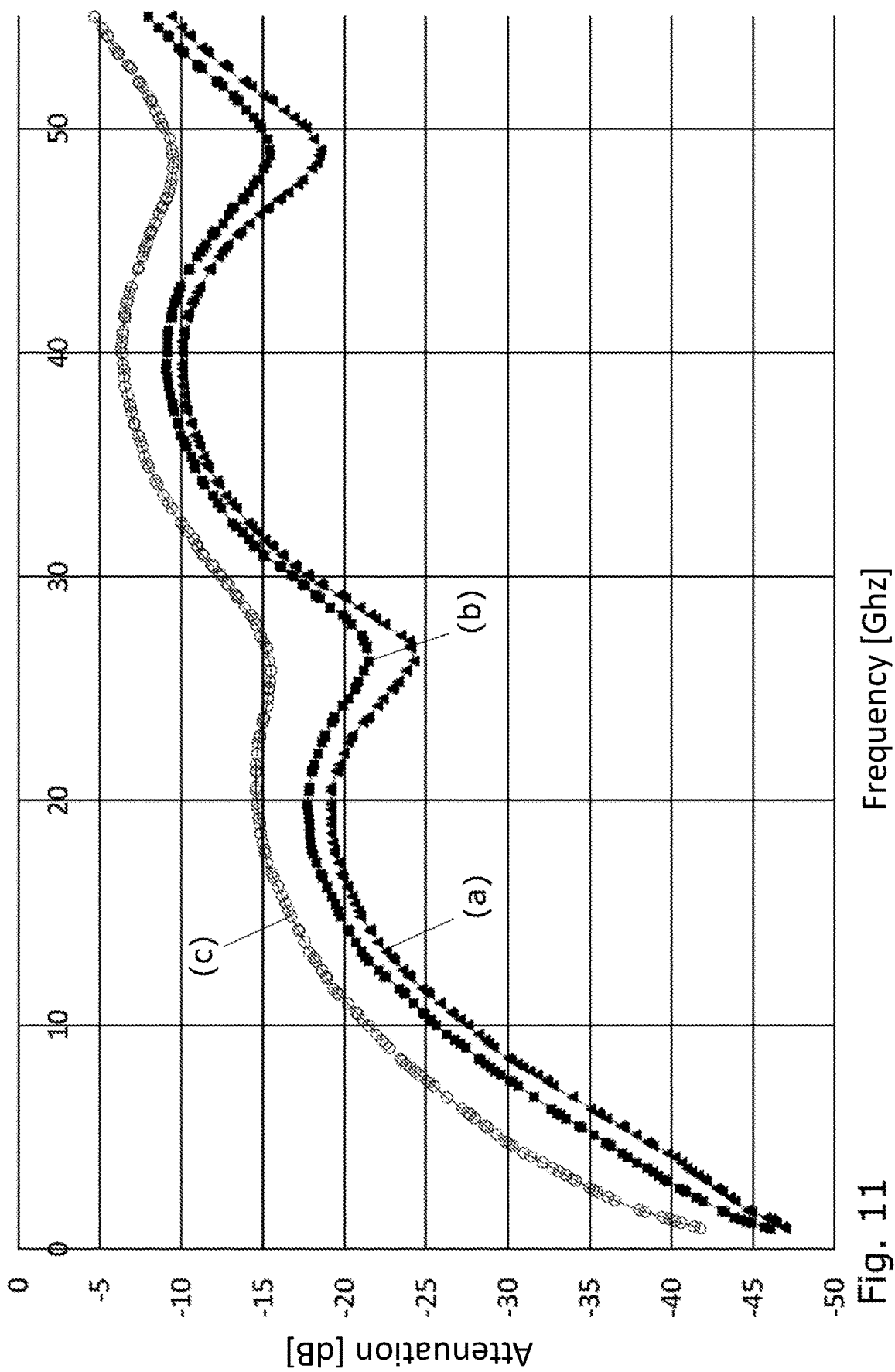
FIG. 11 shows scattering parameter S11 as a function of frequency for different widths of the gap between the two telluride elements in the example of FIG. 10.

It has also been found that the distribution to two telluride elements does not have any significant adverse effect on the radio frequency properties. This is especially true as long as the gap 151 does not become excessively wide. In this respect, FIG. 11 shows the scattering parameter S11 as a function of frequency for different widths of gap 151. The graph of FIG. 11 shows three curves, where curve (a) was calculated for a gap width of 0.1 mm, curve (b) for a width of 1.3 mm of the gap 151, and curve (c) for a width of 2 mm of the gap 152. The calculation shows that the reflection factor hardly increases in a wide range between 0.1 mm and 1.3 mm and only increases more clearly from about 1.5 mm. Accordingly, curves (a) and (b) are close to each other and are spaced apart from curve (c). Therefore it is contemplated according to one refinement of this embodiment of the invention, that two telluride elements 15, 16 are provided, which are spaced apart by 0.1 mm to 1.5 mm.

Figure 12:
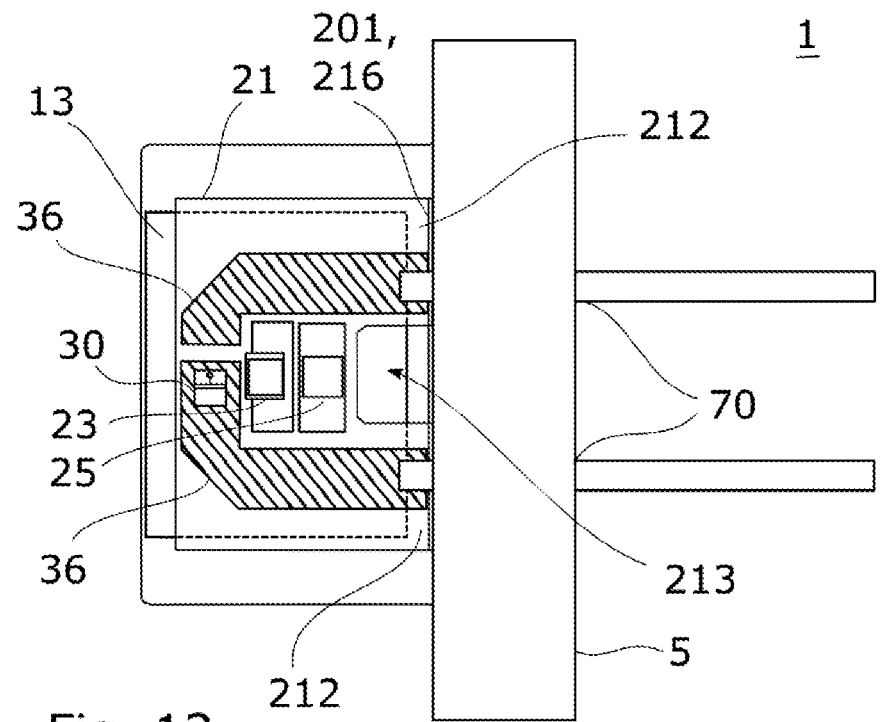
FIG. 12 shows a header including a U-shaped carrier for the electronic component.

In all the examples described so far, the ground conductor connection of a radio frequency line 12 to the electronic component 3 is made via a thermally insulating telluride element. It is also possible to achieve an effective interruption of thermal reflux to the electronic component in another way, even without using a telluride. An embodiment that does not rely on a telluride element is shown in FIG. 12. Like FIG. 10, FIG. 12 shows a plan view of the submount or carrier 21 of header 1, applied on the cold side of thermoelectric cooling element 9. Carrier 21 has a U-shaped contour with a cutout 213 between two legs 212. In this embodiment, the legs 212 are connected to the metallic base body 5.

Figure 13:
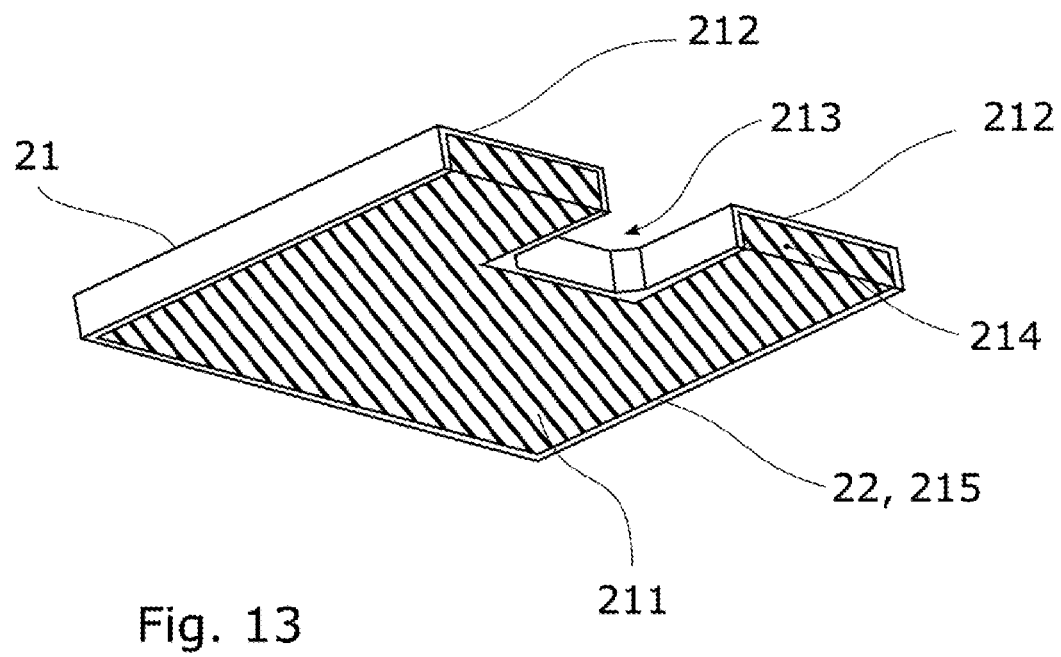
FIG. 13 is a perspective view of the carrier of the example from FIG. 12.

FIG. 13 shows a perspective view of carrier 21. In this figure, the surface bearing on the thermoelectric cooler can be seen, i.e. the back side 211 opposite the mounting surface. The ground conductor 22 of radio frequency line 12 is provided on this surface in the form of a metallization 215. As shown and according to one embodiment, the metallization 215 extends from this surface to and onto the end faces 214. Electrical connection of the ground conductor 22 can then be simply established by electrically connecting the legs 212 with the metallic base body 5, as shown in FIG. 12. The electrical connection between the ground conductor 22 and the metallic base body 5 can basically be produced using a solder or a conductive resin, optionally an epoxy resin.

The reduction in heat flux from the metallic base body 5 to the carrier 21 is achieved in a similar manner to the embodiment of FIG. 10, by reducing the contact area. Thus, according to one aspect of the present disclosure without being limited to the specific example illustrated, a header 1 is provided for an electronic component 10 for radio frequency data transfer, with the header including a metallic base body 5 including a plurality of electrical feedthroughs 7, and with the header 1 including a thermoelectric cooling element 9 which has one side 11 bearing on the base body and an opposite side 13 for mounting the electronic component 3, with a carrier 21 attached to the side 13 intended for mounting the electronic component 3, which carrier has a cutout 213 so as to define two legs 212 between which the cutout 213 is provided, and with the ground conductor 22 of a radio frequency line 12 for electrically connecting the electronic component 3 disposed on the legs 212 and being electrically connected to the metallic base body 5 on the legs 212. In a refinement of this embodiment and as a generalization of the example of FIG. 13 it is furthermore contemplated that the ground conductor 22 is disposed on at least one side of the carrier 21 and includes sections on the end faces of the legs 212. More particularly, the ground conductor may extend around an edge, from one side surface onto the end faces 214.

An optional material for the carrier 21 is generally aluminum nitride or an aluminum nitride containing ceramic, irrespective of the examples shown in the figures. Silicon nitride also exhibits a comparatively high thermal conductivity. Accordingly, in all of the embodiments described with reference to the figures, the carrier 21 may be made of a nitride ceramic, optionally containing aluminum nitride. Aluminum nitride is a good insulator and at the same time exhibits high thermal conductivity. The embodiment with a U-shaped carrier 21 according to FIGS. 12, 13 makes it possible to limit the heat flux from the metallic base body 5 into the carrier 21, despite the good thermal conductivity.

Figure 14:
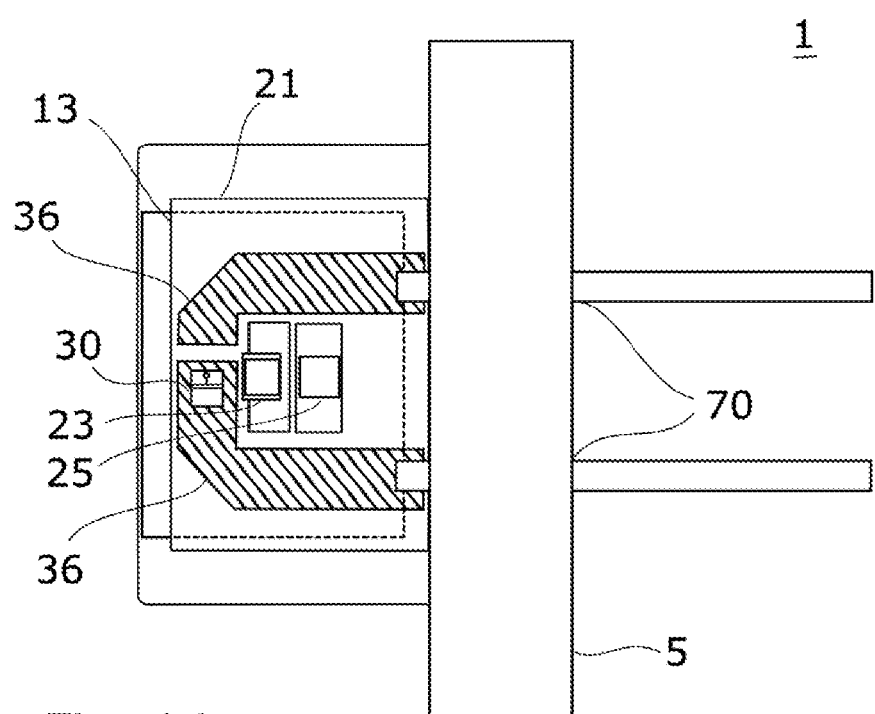
FIG. 14 shows a header with a carrier for the electronic component, which engages on the metallic base body.

Instead of or in addition to reducing the electrical contact area, an option according to a further embodiment is to use a ceramic carrier 21 that has a lower thermal conductivity than aluminum nitride ceramic. It is in particular possible to use a ceramic which has a thermal conductivity of less than 150 W/m·K, optionally not more than 50 W/m·K, i.e. less than half the thermal conductivity of AlN (typically 170 W/m·K). In this case, as shown in FIG. 14, the carrier 21 can be connected to the metallic base body 5 with an edge face 216 of the edge 201 by electrically connecting a ground conductor 22 (not visible in the plan view of FIG. 14) to the metallic base body 5. As in the embodiment of FIGS. 12 and 13, the carrier 21 can be connected to the metallic base body 5 using a solder or a conductive epoxy resin. As in the embodiment shown in FIG. 13, the ground conductor 22 may be disposed on the side of the carrier 21 facing the thermoelectric cooling element and may extend around the edge. The carrier 21 does not need to have a cutout 213 so as to define two legs 212 in this case. Rather, the carrier 21 may have a simple flat cuboid shape, i.e. a shape corresponding to that of the example of FIG. 13 but without a cutout. Accordingly, the carrier 21 in the example of FIG. 14 will have a rectangular contour. A highly suitable ceramic for such an embodiment is an $Al_2O_3$ ceramic. A mixed oxide ceramic containing $Al_2O_3$ may also be used. The embodiments discussed above, on which the example of FIG. 14 is based, can be summarized as follows:

A header 1 is provided for an electronic component 10 for radio frequency data transfer, the header 1 including a metallic base body 5 including a plurality of electrical feedthroughs 7, and the header 1 including a thermoelectric cooling element 9 which has one side 11 bearing on the base body and an opposite side 13, with a carrier 21 for the electronic component 3 attached on the opposite side 13, which carrier includes a high-frequency conductor 12 with a ground conductor 22, the carrier 21 being connected to the metallic base body 5 such that the ground conductor 22 is electrically connected to the metallic base body 5, the carrier 21 being in particular made of a ceramic having a thermal conductivity of less than W/m·K. The carrier 21 is optionally made of an $Al_2O_3$ ceramic. Furthermore, the carrier 21 is optionally bonded to the metallic base body 5 on an edge face 216 thereof. The electrical connection from the metallic base body 5 to the ground conductor 22 can be established by providing the ground conductor such that it extends from one side surface of the carrier around an edge to the edge face 216 that is bonded to the base body 5.

The lower thermal conductivity of the ceramic that is used implies reduced heat flux via the edge face 216 that engages on the metallic base body 5. However, since the larger side surface of the carrier 21 is bearing on the cold side 13 of the thermoelectric cooling element 9, the heat flux is greater there. In this way, effective cooling of the electronic component 3 is still achieved. In addition to the different sizes of the surface of the carrier 21 bearing on the thermoelectric cooling element 9 and the surface contacting the metallic base body 5, a flat cuboid shape of the carrier is also beneficial for the differential heat fluxes. If the carrier 21 is flat, as shown, the distance from the electronic component across the carrier 21 can be designed to be shorter than the distance from the surface contacting the base body 5, i.e.

edge face 216, to the component 3. Generally, it is favorable here if the thickness of the carrier 21 is not more than one third of the major dimension of the edge face 216. With regard to the surfaces, it is favorable if the surface of the carrier 21 bearing on the cold side 13 of the thermoelectric cooling element 9 is larger by at least four times than the edge face 216 which engages on the metallic base body 5.

The position of the carrier 21 is predetermined by the connection of the carrier 21 in contact with the base body 5. However, it can be advantageous to keep a certain amount of clearance for adjustment, as is the case with the embodiments in which the ground conductor of the carrier 21 is connected via an electrical contact 35 on the cold side 13 of the thermoelectric cooling element 9. In these embodiments, as in the example of FIG. 1, there is a spacing between the inner surface 51 of the base body 5 and the carrier 21. This spacing is also favorable with regard to thermal insulation from the metallic base body 5.

Figure 16:
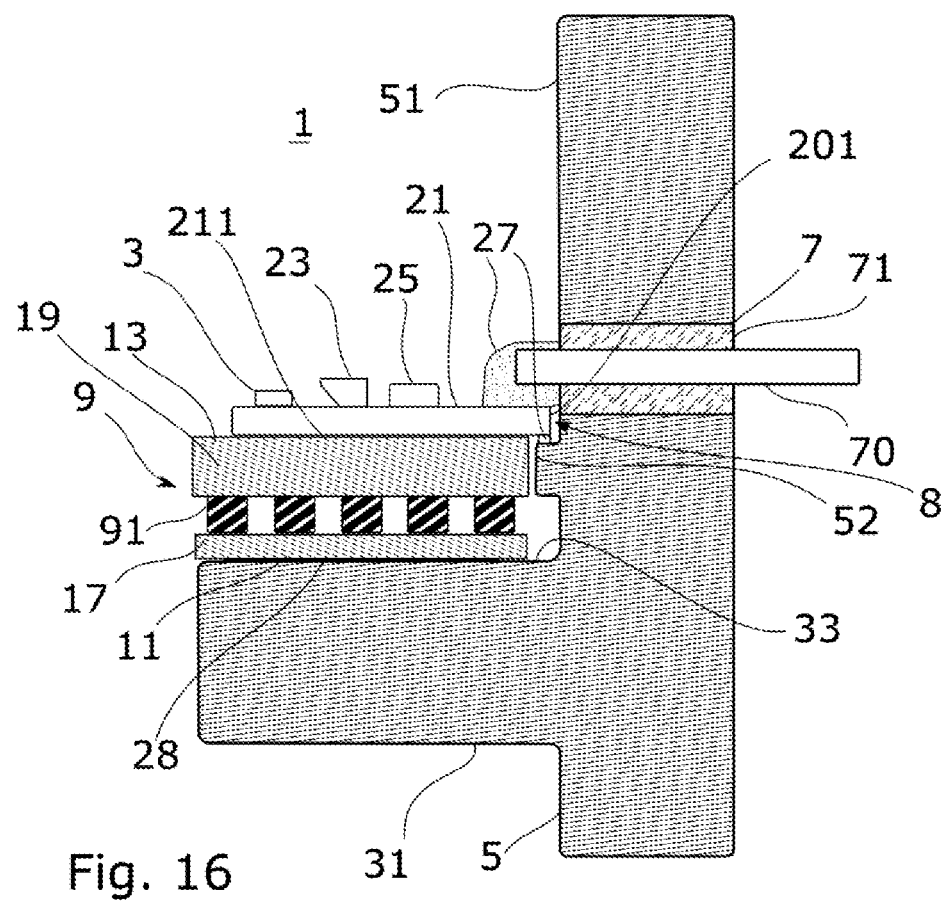
FIG. 16 is a side view of a header 1 including the base body of FIG. 15.

These advantages can be retained with an embodiment of a header 1 in which the metallic base body 5 has at least one, optionally two, protrusions 52 on its inner surface 51. Such a base body 5 is shown in the example of FIG. 5. The one or more protrusions 52 are disposed above the support surface 33 of pedestal 31 for the thermoelectric cooling element 9. FIG. 16 is a side view similar to FIG. 1, showing the header 1 with such a base body 5. As can be seen from FIG. 16, the electrical connection to the ground conductor can be established from the protrusions 52 to the back side 211 of carrier 21 via solder connections 27. As an alternative, the use of a conductive epoxy resin for making the contact is again also possible here. As can furthermore be seen, a gap 8 can be kept between the edge 201 of the carrier and the protrusions 52. This gap 8 reduces the heat flux and on the other hand allows the submount or carrier 21 to be adjusted.

This embodiment is likewise particularly suitable for using a ceramic of lower thermal conductivity for the carrier 21 instead of a highly thermally conductive AlN ceramic, in particular with a thermal conductivity of less than 150 W/m·K, even not more than 50 W/m·K, optionally an $Al_2O_3$ ceramic. Since the ground conductor on carrier 21 is connected on the back side 211, a metallization on an edge 201 or edge face 216 is not required. More generally, without being limited to the specific examples of FIGS. 15, 16, this embodiment can be described as follows:

A header 1 for an electronic component 10 for radio frequency data transfer is provided, wherein the header 1 includes a metallic base body 5 including a plurality of electrical feedthroughs 7, and wherein the header 1 includes a thermoelectric cooling element 9 which has one side 11 bearing on the base body and an opposite side 13 for attaching a carrier 21 for the electronic component 3, wherein the metallic base body has at least one protrusion 52, and wherein the carrier 21 has a ground conductor on its back side 211 bearing on the thermoelectric cooling element 9, and wherein this ground conductor is electrically connected to the at least one protrusion 52. As mentioned above, this optionally leaves a gap between the edge 201 of the carrier 21 and the protrusion 52.

Figure 15:
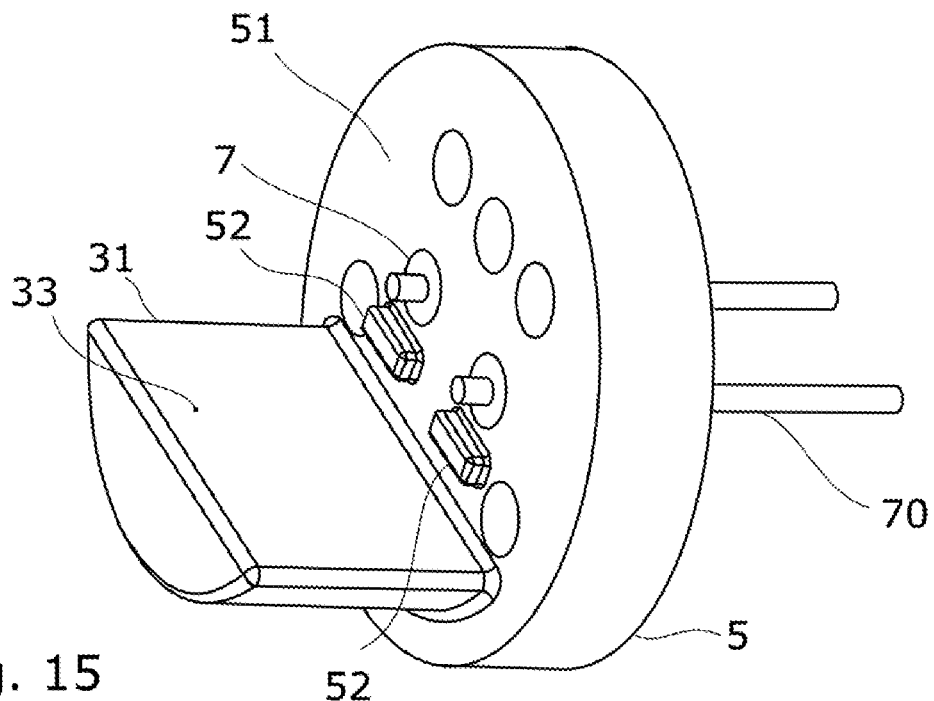
FIG. 15 is a perspective view of a metallic base body of a header having two pedestals for electrically connecting a ground conductor.

This embodiment of FIGS. 15, 16 can also be combined with other embodiments described here, for example with the ceramic of lower thermal conductivity as mentioned above. Also, a carrier 21 provided with a cutout 213 can be used here, for example. Furthermore, the electrical connection between the back-side ground conductor on carrier 21 and the at least one protrusion 52 can be established using a telluride element instead of or in addition to a solder connection 27.

LIST OF REFERENCE NUMERALS

1 Header
3 Electronic component
4 Package
5 Base body of 1
7 Electrical feedthrough
8 Gap
9 Thermoelectric cooling element
10 Packaged electronic component
11 Surface of 9 bearing on 5
12 Radio frequency line
13 Surface of 9 for mounting the electronic component
15, 16 Telluride element
17, 19 Plates of 9
21 Carrier for electronic component 3
22 Ground conductor
23 Monitoring diode
25 Temperature sensor
27 Solder connection
28 Attachment layer
29 Optical transmitter
30 Laser diode
31 Pedestal
33 Support surface of 31
35 Electrical contact
36 Conductor trace
40 Bonding wire
42 Cap
44 Window
46 Ground pin
50 Heating element
51 Inner surface of 5
52 Protrusion on 51
70 Feedthrough conductor
71 Isolation
91 Semiconductor elements of 9
151 Gap between 15, 16
190 Edge face of 19
200 back-side contact of 21
201 Edge of 21
210 Mounting surface of 21
211 back side of 21
212 Leg of 21
213 Cutout in 21
214 End face of 212
215 Metallization
216 Edge face of 21, 201

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A header for an electronic component for radio frequency data transfer, the header comprising:
   a metallic base body including a plurality of electrical feedthroughs;

a thermoelectric cooling element having a first side bearing on the metallic base body and an opposite second side for mounting the electronic component;

a radio frequency line configured for being to the electronic component is provided on the second side for mounting the electronic component, the radio frequency line including a ground conductor that is electrically connected to the metallic base body by way of an electrical connection, the electrical connection to the metallic base body including a telluride element.

2. The header of claim 1, wherein the second side of the thermoelectric cooling element configured for mounting the electronic component has an electrical contact that is electrically connected to the metallic base body by way of a ground electrical connection of the radio frequency line to the electronic component.

3. The header of claim 2, wherein the electrical connection is the ground electrical connection, which includes the telluride element, which includes bismuth telluride.

4. The header of claim 3, comprising at least one of the following:
(1) the telluride element is connected to the base body and establishes the electrical connection to the ground conductor; and
(2) at least two telluride elements, which are arranged spaced apart from one another by a gap, the gap having a width ranging from 0.1 mm to 1.5 mm.

5. The header of claim 1, further including the electronic component and a carrier, wherein the electronic component is mounted on the carrier, the carrier bearing on the second side of the thermoelectric cooling element for mounting the electronic component.

6. The header of claim 1, further including the electronic component and a carrier including an edge, wherein the electronic component is mounted on the carrier which is fixed to the base body in such a way that a gap is provided between the base body and the edge of the carrier.

7. The header of claim 1, wherein the thermoelectric cooling element includes a plate including a surface and an edge face, wherein the second side of the thermoelectric cooling element for mounting the electronic component is the surface of the plate of the thermoelectric cooling element, wherein the telluride element is arranged on the edge face of the plate.

8. The header of claim 1, further including the electronic component and a carrier, wherein the electronic component is arranged on the carrier that is connected to the thermoelectric cooling element, the carrier having a conductor trace for electrically connecting the electronic component, which is directly connected to a feedthrough conductor of one of the plurality of electrical feedthroughs by a solder connection.

9. The header of claim 8, wherein the solder connection is made of a gold-tin solder.

10. The header of claim 1, further including the electronic component, wherein the electronic component and the thermoelectric cooling element are mounted using a gold-tin solder.

11. The header of claim 1, further including the electronic component, wherein at least one electrical connection to the electronic component is formed as a waveguide formed as one of a coplanar waveguide with ground and a strip-type waveguide with ground, the waveguide comprising an electrode that is electrically connected to the base body via the telluride element.

12. The header of claim 11, further including a carrier, wherein the electrode is defined by a 2-dimensional backside contact on the carrier.

13. The header of claim 1, further including the electronic component and a carrier, wherein the electronic component is mounted on the carrier, wherein the carrier has a conductive layer on the second side of the thermoelectric cooling element, which is electrically connected to the telluride element.

14. The header of claim 1, wherein the base body of the header comprises a pedestal having a support surface on which the thermoelectric cooling element is mounted.

15. The header of claim 1, further including the electronic component, wherein the electronic component includes an optical transmitter, which is a laser diode.

16. The header of claim 1, wherein the header includes an electronic component formed as one of a temperature sensor and a monitoring diode.

17. The header of claim 1, wherein the telluride element includes at least one of antimony telluride and bismuth selenide.

18. The header of claim 1, further including a carrier including a back side, the second side attaching the carrier for the electronic component, the metallic base body having at least one protrusion, and wherein the carrier has a carrier ground conductor on the back side bearing on the thermoelectric cooling element, wherein the carrier ground conductor is electrically connected to the at least one protrusion.

19. A header of claim 1, further including a carrier, wherein the carrier for the electronic component is disposed on the second side, wherein the carrier is connected to the metallic base body in such a way that the ground conductor is electrically connected to the metallic base body, wherein the carrier is made of a ceramic having a thermal conductivity of not more than 50 W/m·K.

20. A header of claim 1, further including a carrier, wherein the second side for mounting an electronic component has the carrier mounted thereto, which includes two legs and a cutout therebetween, and wherein the ground conductor of the radio frequency line for electrically connecting the electronic component is disposed on the legs and is electrically connected to the metallic base body on the legs.

21. A packaged electronic component, comprising:
a header for an electronic component for radio frequency data transfer, the header including:
a metallic base body including a plurality of electrical feedthroughs;
a thermoelectric cooling element having a first side bearing on the metallic base body and an opposite second side for mounting the electronic component;
a radio frequency line configured for being to the electronic component is provided on the second side for mounting the electronic component, the radio frequency line including a ground conductor that is electrically connected to the metallic base body by way of an electrical connection, the electrical connection to the metallic base body including a telluride element.

22. A method for producing a header for an electronic component for radio frequency data transfer, the method comprising the steps of:
providing a metallic base body that has a plurality of electrical feedthroughs;
connecting a first side of a thermoelectric cooling element to the metallic base body; and mounting an electronic component on an opposite second side of the thermoelectric cooling element, the second side for mounting the electronic component having an electrical contact which is electrically connected to the metallic base body by way of an electrical connection which provides a ground conductor connection of a radio frequency line to the electronic component, the electrical connection being made via a telluride element.

23. The method of claim 22, wherein the step of connecting and the step of mounting are each made using a gold-tin solder, wherein the gold-tin solder is melted in a heating step for the steps of connecting and mounting.

\* \* \* \* \*